(12) United States Patent
McGuiness et al.

(10) Patent No.: US 7,368,906 B2
(45) Date of Patent: May 6, 2008

(54) TOOL FOR MEASURING MAGNETIC PROPERTIES AT HIGH TEMPERATURES

(75) Inventors: Paul John McGuiness, Ljubljana (SI); Gregor Gersak, Ljubljana (SI); Spomenke Kobe, Ljubljana (SI)

(73) Assignee: Institute Jozef Stefan, Ljubljana (SI)

( * ) Notice: Subject to any disclaimer, the term of this patent is extended or adjusted under 35 U.S.C. 154(b) by 0 days.

(21) Appl. No.: 10/574,936

(22) PCT Filed: Oct. 7, 2003

(86) PCT No.: PCT/EP03/11086

§ 371 (c)(1),
(2), (4) Date: Feb. 23, 2007

(87) PCT Pub. No.: WO2005/040842

PCT Pub. Date: May 6, 2005

(65) Prior Publication Data

US 2007/0216404 A1    Sep. 20, 2007

(51) Int. Cl.
*G01N 27/72*    (2006.01)
*G01R 33/00*    (2006.01)

(52) U.S. Cl. .................................................... 324/224

(58) Field of Classification Search ................ 324/201, 324/202, 244, 205, 248, 259, 229, 260–262, 324/224, 226
See application file for complete search history.

(56) References Cited

U.S. PATENT DOCUMENTS 2,502,628 A    4/1950    Maynard 3,720,870 A * 3/1973 Sueda .......................... 324/239
6,201,386 B1 * 3/2001 Jones et al. .................. 324/205
6,843,106 B2 * 1/2005 Swersey et al. ................ 73/38

FOREIGN PATENT DOCUMENTS

SU    890 286 A    12/1981
SU    922 672 A    4/1982

OTHER PUBLICATIONS

British Standards Institution, "Magnetic Materials", Part 5. Methods of measurement of the magnetic properties of magnetically hard (permanent magnet) materials, BS 6404: Part 5: 1986, IEC 404-5: 1982.

(Continued)

*Primary Examiner*—Reena Aurora
(74) *Attorney, Agent, or Firm*—Venable LLP; Robert Kinberg

(57) ABSTRACT

The present invention relates to a measuring tool for measuring magnetic properties of a magnetic sample in a closed loop, comprising an electromagnet in a closed loop arrangement with two pole pieces connected to a yoke, said pole pieces forming a gap for the placement of the sample, a search coil for the measurement of a flux density B of the sample and a magnetic field sensor for the measurement of a magnetic field strength H in the gap between said pole pieces. The pole pieces comprise heater elements for heating the pole pieces to temperatures of at least 400° C. and are thermally insulated against the yoke of the electromagnet. The pole pieces, the search coil and the magnetic field sensor are made of materials which resist said high temperatures. The measuring tool allows the non-destructive measurement of magnetic properties of magnetic samples in closed circle up to 500° C.

10 Claims, 3 Drawing Sheets

OTHER PUBLICATIONS

McGann D W: "Development of a Low Loss, High Precision Permeameter for the Evaluation of High Energy Permanent Magnets" Journal of the Audio Engineering Society, Audio Engineering Society. New York, US, vol. 10, No. 3, Jul. 1962, pp. 194-199, XP000796480 ISSN: 0004-7554.

J.P. Barranger: "Very High Temperature Permeameter" Journal of Applied Phisics, vol. 42, No. 4, Mar. 15, 1971, pp. 1796-1797, XP002279210.

* cited by examiner

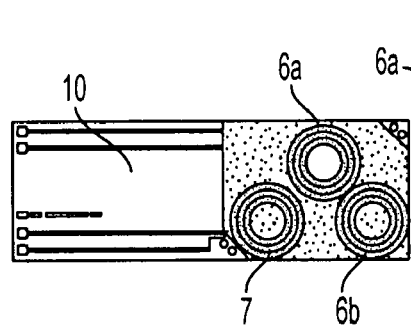
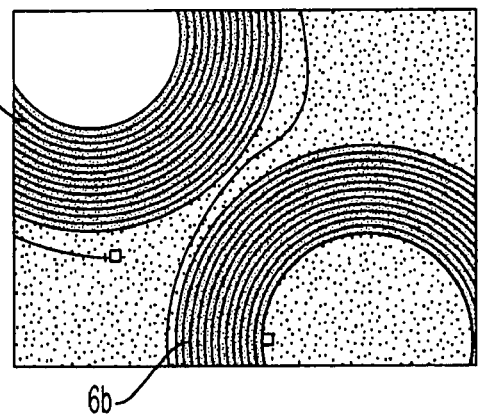
FIG. 4A  FIG. 4B
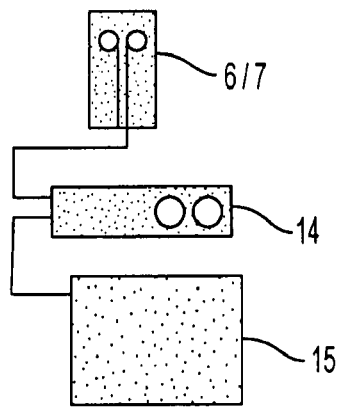
FIG. 5
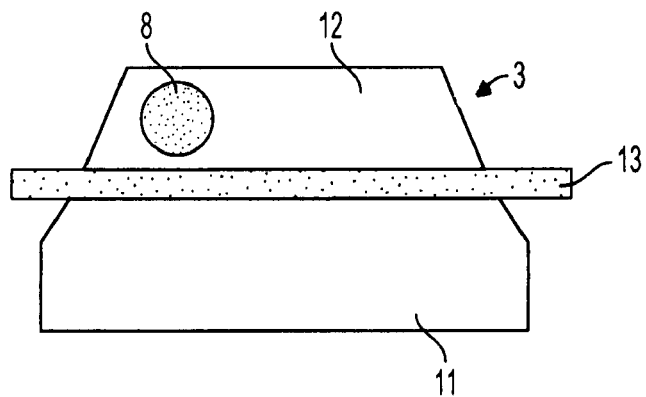
FIG. 6

TOOL FOR MEASURING MAGNETIC PROPERTIES AT HIGH TEMPERATURES

TECHNICAL FIELD

The present invention relates to a measuring tool for measuring magnetic properties of a magnetic sample in a closed loop, comprising an electromagnet in a closed loop arrangement with two pole pieces connected to a yoke, said pole pieces forming a gap for the placement of the sample, a search coil for the measurement of a flux density B of the sample and a magnetic field sensor for the measurement of a magnetic field strength H in the gap between said pole pieces.

Measuring tools of this kind are used for example to measure magnetic properties of high-energy magnets. The results of the measurement are the values of remanent magnetization ($B_r$), coercivities ($H_{CI}$ and $H_{CB}$), energy product (($BH$)$_{max}$) and the shape of the hysteresis loop, which indicates the homogeneity of the microstructure of the magnetic material.

In the last fifty years remarkable progress—both revolutionary and evolutionary—has been made in magnetic materials. Modern permanent magnets have been developed from Alnico's with maximum energy product $(BH)_{max}$~65 kJ/m³ to the strong rare earth magnets of SmCo$_5$ (1:5) and Sm(Co, Fe, Cu,Zr)$_z$ (2:17) with $(BH)_{max}$~240 kJ/m³ to the Nd—Fe—B super magnets with $(BH)_{max}$~320 kJ/m³. We are still far from the theoretical limit, which is for a Fe—Co-rich alloy with a value over 800 kJ/m³.

The annual global production of RE-TM-B and RE-TM-N magnets is presently over 10000 tonnes. The magnetic properties of these magnets however rapidly degrade as temperature is increased and they cannot be used above temperatures of 150° C.-180° C. From these temperatures and up to 300° C., the Sm(Co, Cu, Fe, Zr)$_z$ magnets are preferred to the Nd—Fe—B and Sm—Fe—N. Above this temperature, no material is available although important potential applications exist in the fields of aeronautics, the space (satellite) industry, electronics, and the automotive (petrol and electric) industry.

The progress made in new generations of magnetic materials has allowed the dramatic miniaturisation of devices in which the magnet was previously a major part of the volume and weight of the device. High-energy permanent magnets are crucial components in a majority of high technology systems and subsystems, which require large and stable magnetic fields over a wide variety of environmental conditions. Examples include microwave tubes, klystrons, gyroscopes and accelerometers, reaction and momentum wheels to control and stabilise satellites, magnetic amplifiers and bearings.

For these applications the materials are required to have uniform and stable magnetic properties over the temperature range from 50 to 200° C. SmCo$_5$ and Sm$_2$Co$_{17}$-type magnets are ideal for these applications because of their high Curie temperatures and magneto crystalline anisotropies, which lead to low temperature coefficients of remanence (d$M_r$/dT) and coercivity (d$H_c$/dT). However, there is now a need for permanent magnets, which can operate at much higher temperatures, up to 450° C. This has arisen from a drive to replace hydraulic systems in aeronautics with electromechanical devices, to develop systems such as airborne motor/generators integrated with turbine engines and hybrid magnetic bearings for turbine engines, as well as the need for high performance high temperature magnets for electric vehicles. These require that both magnetic properties and mechanical strength be improved at high temperatures.

Recent research in the United States has shown the potential for producing 2:17-type materials (Sm—Co) with a very low temperature coefficient of coercivity and the remarkably high coercivity of 1 T at 500° C. This represents the state of the art in terms of maintaining high coercivity at high temperature, but there is a cost in remanence. This leaves further opportunities for improved properties, by further increasing the coercivity, and by increasing the remanence (and thereby the energy product) while maintaining the high temperature coercivity.

The contribution of permanent magnets to the level of our technologies and the degree to which these small but important components enable progress is difficult to quantify. Magnets are often a small but critical component in many other devices. Thus they are a major factor in the enabling of many other technologies.

Some examples are in the areas of transport. To realise a family size vehicle many components, which combine lightness, high working temperatures and energy efficiency, are needed. A high performance magnet for use at high temperatures ("under the hood" applications) is currently one of the key components yet to be developed. The benefits to the environment, and the economic benefits of such developments are enormous.

A further problem arising with the development of high energy magnets for operation at high temperatures is the measurement of the magnetic properties of these magnets at such high temperatures. The development of high temperature materials requires the ability to fully characterise these materials at their target operating temperatures in excess of 200° C.

STATE OF THE ART

Permeameters, i. e. devices for measuring the magnetic properties, are also known as hysteresismeters and permeagraphs. They work by driving the magnet around its hysteresis loop using an applied field from the electromagnet. The measurement system then detects the applied field H and the samples response to the applied field, the magnetisation J or the flux density B. Soft and hard materials can be measured, including rare earth. The limit for rare earth materials is the value of coercivity of the sample. For samples that have a suitable coercivity and saturation value, it is possible to obtain full loops, not just single quadrants of the hysteresis curve.

Current known permeameters, available either from commercial suppliers or existing within research infrastructures are not constructed to determine closed loop properties of magnets above 200° C. A typical known permeameter, as disclosed for example in BSI—British Standard: Magnetic materials; BS 6404: Part 5: 1986, IEC 404-5: 1982, comprises an electromagnet in a closed loop arrangement with two pole pieces connected to a yoke, the pole pieces forming a gap for the placement of the magnetic sample, a search coil for the measurement of the flux density B of the sample and a magnetic field sensor for the measurement of the magnetic field strength H in the gap between said pole pieces.

The object of the present invention is to provide a measuring tool for non-destructive measuring the magnetic properties of magnetic samples in closed circle up to 500° C. The measurement is in particular required for the characterization of a new generation of permanent magnets based on intermetallic alloys between rare earths (RE) and transition metals (TM) for the application in aeronautics and space industry.

SUMMARY

The object is achieved with the measuring tool according to claim 1. Advantageous embodiments of the measuring tool are indicated in the dependent claims and/or described in detail in the following paragraphs.

The present measuring tool comprises an electromagnet in a closed loop arrangement with two pole pieces connected to a yoke, said pole pieces forming a gap for the placement of the sample, a search coil for the measurement of a flux density B of the sample and a magnetic field sensor for the measurment of a magnetic field strength H in the gap between said pole pieces. In order to achieve a measurment at high temperatures the pole pieces comprise heater elements for heating the pole pieces to high temperatures of at least 450° C., preferably up to 500° C. and are thermally insulated against the yoke of the electromagnet. Furthermore, the pole pieces, the search coil and the magnetic field sensor are made of materials which resist said high temperatures.

In a preferred embodiment of the measuring tool, the search coil is made of two flat coil elements in a reverse J compensating configuration and the magnetic field sensor is also made of a flat coil. All coils are made using thick-film technology and are arranged on a common substrate. The pole pieces consist of a base piece for the connection to the yoke, a pole piece body forming the closed magnetic circuit with the sample, an insulating layer between the base piece and the pole piece body for a reduction of heat losses and at least one heater element integrated in the pole piece body.

For the measurement the electromagnet is connected to a electromagnet power supply and an electromagnet control unit. The search coil as well as the coil for measurement of the magnetic field strength are connected to two integrating fluxmeters. The heater elements of the pole pieces are connected to a controlling power supply. An example for carrying out such a measurement is shown e. g. in BSI—British Standard: Magnetic materials; BS 6404: Part 5:1986, IEC 404-5: 1982. In addition to this example, in the present case the pole pieces are heated via the power supply controlling the heater elements to the desired measuring temperature.

BRIEF DESCRIPTION OF THE DRAWINGS

The following is a description of embodiments of the present measuring tool in connection with the drawings. In the drawings FIGS. 1 to 3C show an example of the fabrication of a search coil of the present measuring tool using thick-film technology;

FIGS. 4A and 4B show a second example of the coil layout of a search coil together with the coil for measuring the magnetic field strength of the present measuring tool as well as a close up of the search coil conducting tracks;

FIG. 5 shows a schematic view of the ECU connected between the search coil and the fluxmeter;

FIG. 6 shows a cross section of an embodiment of a pole piece of the present measuring tool;

DETAILED DESCRIPTION

Figure 8:
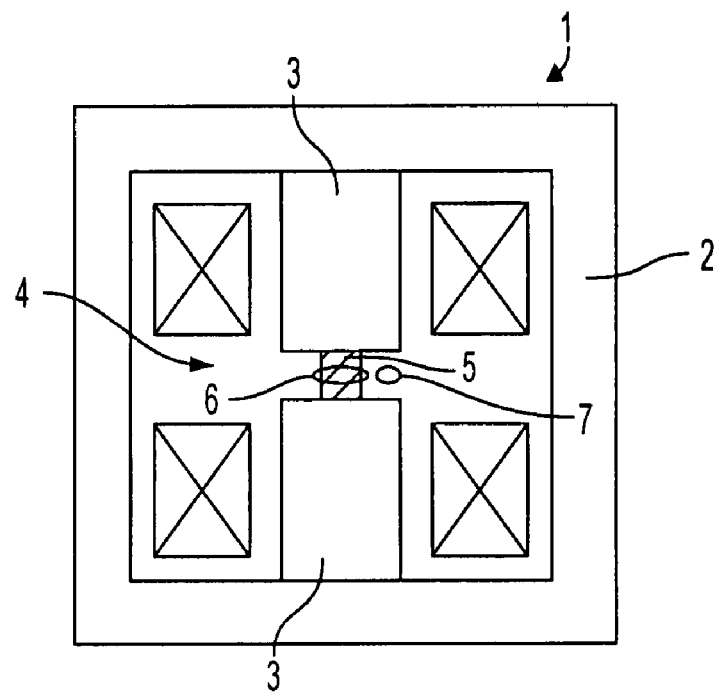
FIG. 8 an example for the arrangement of the components of a measuring tool according to the present invention.

A high-temperature permeameter is a measuring tool for measuring the properties of magnetic materials in a closed-loop configuration. The measurement of the magnetisation $J(H)=B-\mu_0 \cdot H$ is critical for testing modern permanent magnet materials with high coercive fields, for example: samarium-cobalt alloys, neodymium-iron-boron alloys and samarium-iron nitrides. FIG. 8 shows an example for the arrangement of the components of a measuring tool according to the present invention. The measurement tool comprises an electromagnet 1 in a closed loop arrangement with two pole pieces 3 connected to a yoke 2. The pole pieces 3 form a gap 4 for the placement of the sample 5. The measurement tool furthermore comprises two coils, one of which 6 measures the flux density B of the sample 5 and the other 7 records the field strength close to the sample 5. By connecting the two coils 6, 7 in a differential configuration a fluxmeter is able to record the value of $B-\mu_0 \cdot H$.

The high-temperature permeameter is connected to an electromagnet power supply, an electromagnet control unit, two integrating fluxmeters, and a controlling power supply for the heated pole pieces. These components which are not shown in the figures can be provided separately or can be part of the present measuring tool.

Electronic fluxmeters are sensitive integrators with low drift and high input resistance. The accuracy of the fluxmeter is based on the drift, as the integration error can be kept relatively low by using a high degree of amplitude. With a drift of, for example, $10^{-5}$ Vs/minute, a flux of $10^4$ Vs with a coil of 100 turns will by wrong by a maximum of 0.1% after one minute.

In order to demagnetise a high-coercivity sample an electromagnet with a sufficiently large field is required. Modern magnetic materials can have coercivities in excess of 3 Tesla, however, a practical electromagnet with a 5-10-mm gap would normally be in the range 1.5-2.5 Tesla. The diameter of the pole pieces 3 must be sufficient to allow for a completely uniform field in the region of the sample and the point where the field strength is determined. A practical minimum for measurements of samples 5 with diameters of 10-15 mm would be a pole diameter of 75 mm. The heated pole pieces 3 must be well insulated from the main body of the electromagnet yoke 2 in order to minimise heat losses and an unnecessarily large consumption of power. The insulating material must be designed to have the minimum effect on the magnetic field flowing from the main body of the yoke 2 into the pole pieces 3. The insulation gap should not exceed 7-8 mm. The pole-piece heaters must be supplied with sufficient power to raise the temperature of the pole-piece surface that is in contact with the magnet to 400° C.

The J(H) curve of permanent magnets with any cross section can be measured with a $J=B-\mu_0 \cdot H$ compensated coil and a fluxmeter with an adjustable measuring constant. The J-compensated surrounding coil 6 consists of 2 concentric fractional coils 6a, 6b of equal turn areas ($N_1$ and $N_2$) that are connected in opposition so that without a magnet sample 5 in the homogenous field produced by the electromagnet pole pieces 3 the coil 6 registers no flux. However, with a sample 5 of cross-section A, a flux $\phi=N_1 \cdot A \cdot J$ is recorded. In order to measure the magnetic properties of materials in the range of 400° C. the J-compensated surrounding coil 6 and the coil 7 for measuring the magnetic field strength, together with any fixtures necessary to hold the coils in place must be able to withstand the effects of the temperature without the risk of any short-circuiting of the coil windings.

EXAMPLE 1

Figure 1:
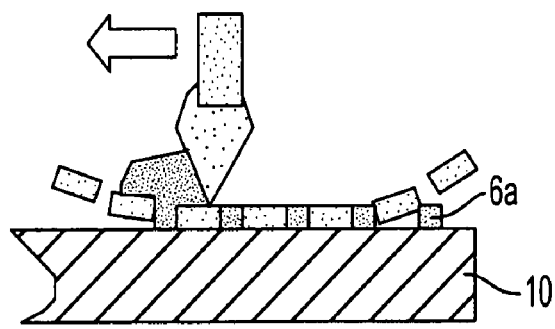

In a first embodiment the coils 6a, 6b are designed to operate between room temperature and 500° C. The coils are built up using a multi-layer combination of thick-film layers and insulator layers. The coil holder is a 96% laser-cut alumina substrate 10 with dimensions 1.5×50×90 mm. Using a screen-printing technique the first coil layer 6a of the coil 6 is applied to the surface of the substrate 10 as can be seen in FIG. 1.

Figures 2A, 2B:
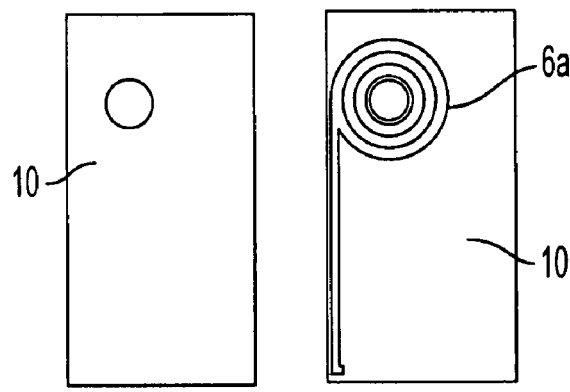

The coil layer is fabricated with a thick-film coating of silver-palladium (3:1) and consists of an inwardly-turning spiral with an outside diameter of 25 mm and an internal diameter of 13 mm. FIG. 2A shows the plain substrate 10 and FIG. 2b shows the substrate 10 with the first coil layer 6a.

The next stage involves firing the coil layer 6a on the substrate 10. The initial firing is at 150° C. for 15 minutes; this is followed by a high-temperature firing at 850° C. for 30 minutes. On top of the coil layer 6a we put an insulating layer 9. This layer 9 is almost complete except for a small via of approximately 0.3 mm to allow an electrically conducting connection to be made through the insulating layer 9. This insulating layer 9 is then fired at 150° C. for 15 minutes and 850° C. for 60 minutes.

A second conducting coil layer 6b is applied over the insulating layer 9 to complete the coil 6. Then a final insulating layer 16 is applied to provide electrical insulation and protection from damaging knocks and scratches. The reverse J-compensating coil and the magnetic field strength coil are applied in the same way.

Figures 3A, 3B, 3C:
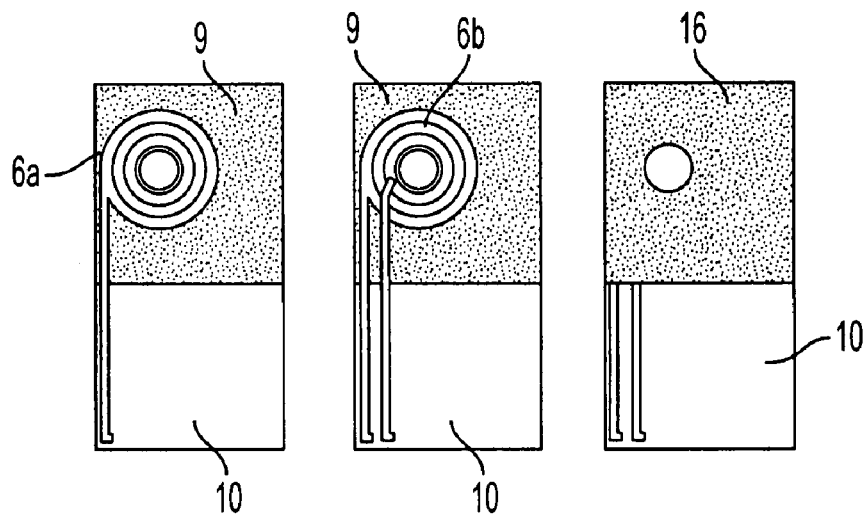

FIG. 3A shows the first insulating layer 9, FIG. 3B shows the second coil layer 6b and FIG. 3C shows the top insulating layer 16.

EXAMPLE 2

In a second embodiment the reverse J-compensating coil 6 and the field-measuring coil 7 are elaborated in the same way as in Example 1, but with a different construction. Of the whole new coils have a circular H coil 7 and redesigned J coils 6a, 6b with fewer turns and larger spacing between the individual turns. The layout out the coils was also slightly altered to reduce the risks of short-circuiting. The design of the new J-coil 6 and a close up of the conducting tracks can be seen in FIGS. 4A and 4B. FIG. 4B shows a close up of the J-coil 6 conducting tracks.

The stability of the coils was tested at tested for a range of temperatures from 450° C. to 650° C. The results of these stability trials are as follows:

| Resistance changes | |
|---|---|
| 450° C./100 hours | <1.0% |
| 550° C./100 hours | <1.0% |
| 650° C./100 hours | <2.0% |

In order to reduce the effects of thermally induced voltages and resistance changes at high temperature an electronic conditioning unit (ECU) 14 is developed that will be installed between the coils 6, 7 and the fluxmeters 15. A schematic view of the ECU 14 can be seen in the FIG. 5.

The heated pole pieces 3 consist of four main components: a base piece 11, for connecting to the yoke 2; an insulating layer 13, to reduce heat losses; the pole piece body 12, which forms the closed magnetic circuit with the test sample 5; and the heater element 8 (FIG. 6).

Figures 7A, 7B:
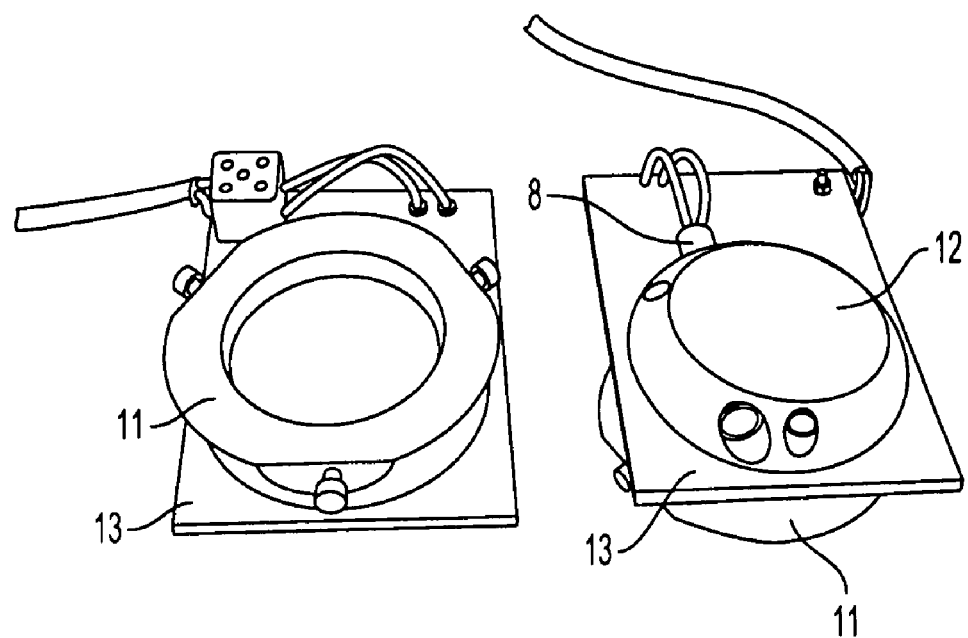
FIGS. 7A and 7B show a schematic of an embodiment of the two pole pieces used in the present measuring tool.

Both the base piece 11 and the pole piece body 12 are round and machined from pure iron. The insulating piece 13 is 100.times.200 mm and 6-mm thick. The material is mica based, it has a density of about 2.2 kg/dm.sup.3 and a thermal conductivity of 0.26 W/mK. The heaters 8 are made from NiCr 8020 wire with pure magnesium oxide. Each heater 8 is 12.5 mm in diameter and 60-mm long (FIGS. 7A and 7B).

| List of Reference Signs | |
|---|---|
| 1 | electromagnet |
| 2 | yoke |
| 3 | pole piece |
| 4 | gap |
| 5 | magnetic sample |
| 6 | search coil |
| 6a | flat coil element |
| 6b | flat coil element |
| 7 | magnetic field strength measuring coil |
| 8 | heater element |
| 9 | insulating layer |
| 10 | common substrate |
| 11 | base piece |
| 12 | pole piece body |
| 13 | insulating layer |
| 14 | ECU |
| 15 | fluxmeter |
| 16 | top insulating layer |

The invention claimed is:

1. Measuring tool for measuring magnetic properties of a magnetic sample in a closed loop, comprising
    an electromagnet in a closed loop arrangement including two pole pieces connected to a yoke said pole pieces forming a gap for placement of the sample,
    a search coil for the measurement of a flux density B of the sample and
    a magnetic field sensor for measurement of a magnetic field strength H in the gap between said pole pieces,
    characterized in that
    the pole pieces comprise heater elements for heating the pole pieces to high temperatures of at least 450° C., the pole pieces are thermally insulated against the yoke of the electromagnet, and the pole pieces, the search coil and the magnetic field sensor are made of materials which resist said high temperatures.

2. A measuring tool according to claim 1, characterized in that
    the search coil is made using thick-film technology.

3. A measuring tool according to claim 2, characterized in that
    the search coil is made of two concentric flat coil elements of equal turn areas arranged one above the other and separated by an insulating layer having a via through which the two concentric flat coil elements are connected.

4. A measuring tool according to claim 1, characterized in that
    the magnetic field sensor is a flat coil.

5. A measuring tool according to claim 4, characterized in that
    the coil of the magnetic field sensor is made using thick-film technology.

6. A measuring tool according to claim 5, characterized in that the magnetic field sensor includes a coil, and the coil of the magnetic field sensor and the search coil are arranged on a common substrate.

7. A measuring tool according to claim 1, characterized in that each of the pole pieces comprises a base piece for the connection to the yoke, a pole piece body forming the closed magnetic circuit with the sample, an insulating layer between the base piece the pole piece body for a reduction of heat losses and at least one heater element integrated in the pole piece body.

8. A measuring tool according to claim 7, characterized in that the base piece and the pole piece body have a circular cross section and are machined from pure iron.

9. A measuring tool according to claim 7, characterized in that the insulating layer comprises a material which is mica based and has a density of about 2.2 kg/dm$^3$ and a thermal conductivity of about 0.26 W/mK.

10. A measuring tool according to claim 9, characterized in that the insulating layer has lateral dimensions of 100×200 mm and is 6-mm thick.

* * * * *